(12) United States Patent
Ray et al.

(10) Patent No.: US 6,524,767 B1
(45) Date of Patent: Feb. 25, 2003

(54) USE OF METAL COMPOUNDS IN IMAGABLE ARTICLES

(75) Inventors: Kevin Barry Ray, Castleford (GB); Anthony Paul Kitson, Leeds (GB); Alan Stanley Victor Monk, Warrington (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 113 days.

(21) Appl. No.: 09/696,870

(22) Filed: Oct. 26, 2000

(51) Int. Cl.$^7$ .............................. G03F 7/004; G03F 7/09
(52) U.S. Cl. ................................ 430/273.1; 430/270.1; 430/271.1; 430/944
(58) Field of Search ........................... 430/270.1, 271.1, 430/280.1, 273.1, 944

(56) References Cited

U.S. PATENT DOCUMENTS 3,794,496 A * 2/1974 Manhardt .................. 96/114.1
4,916,115 A * 4/1990 Mantese et al. ............... 505/1

OTHER PUBLICATIONS

Gove, Philip Babcock, ed in chief, Webster's Third New International Dictionary of the English Language Unabridged, Merriam Webster Inc., United States of America, copyright 1981, p. 28, 466, 1448–449.*

Merriam–Webster's collegiate Dictionary, your Dictionary.com, internet citation of "combine" printed out on Aug. 14, 2002 as www.yourdictionary.com, two pages.*

IBM Technical Disclosure Bulletin, "Cupric Formate/ Poly-(Vinyl Alcohol) Film for Laser Deposition of Copper Metal" vol. 31, Issue 6, pp. 377–380, Nov. 1, 1988.*

IBM Technical Disclosure Bulletin, "Laser Plating System for Printed Circuitry", Jul. 1972, vol. 15, No. 2, pp. 603–64.*

* cited by examiner

*Primary Examiner*—Cynthia Hamilton
(74) *Attorney, Agent, or Firm*—Faegre & Benson LLP

(57) ABSTRACT

An imagable article comprises a thermally imagable coating on a substrate, the coating comprising a radiation absorbing compound and a metal compound which is thermally decomposable, to form a metal. The imagable article is imagewise exposed to electromagnetic radiation, which is converted to heat by the radiation absorbing compound. The imaged article is then subjected to a developer, and in regions that have been exposed the thermally decomposable metal compound is decomposed to elemental metal, and regions that have not been exposed dissolve in the developer leaving behind the regions of elemental metal.

18 Claims, No Drawings

USE OF METAL COMPOUNDS IN IMAGABLE ARTICLES

FIELD OF THE INVENTION

This invention relates to the use of metal compounds in imagable articles. In particular the invention relates to the use of thermally decomposable metal compounds in imagable coatings on electronic parts, lithographic printing plates and their precursors.

BACKGROUND OF THE INVENTION

Conventionally, lithographic printing plates and electronic parts, such as printed circuit boards (PCBs), which have image areas consisting of elemental metal, (herein after referred to as "metal image lithographic printing plates" or "metal image electronic parts") have been prepared using multi-stage subtractive or additive techniques.

Conventional metal image lithographic printing plates are generally bimetal plates consisting of a metal image on a substrate of, for example, aluminium or stainless steel. Usually a continuous layer of metal is deposited onto the substrate and the resultant layer is then etched to leave the desired image. This process is a subtractive process, and the metal used to layer the plate is generally copper, which can then be etched with suitable chemical etchants such as ferric chloride.

An example of an additive process which has been used to create metal image lithographic plates, consists of depositing a metal through a stencil onto a substrate to form the desired image, for example by precipitating a metal from a corresponding metal salt solution.

In both additive and subtractive processes used to prepare metal image lithographic printing plates, the resultant metal image areas are oleophilic, or ink-accepting, whereas the background substrate is hydrophilic or ink-repelling.

EP 407 081 A discloses a method of producing a metal image lithographic printing plate by applying a copper salt or copper compound to a substrate and then irradiating the desired image areas with controlled electromagnetic radiation to decompose the copper salt or copper compound and deposit an image of metallic copper on the substrate. The remaining non-imaged areas of copper salt or copper compound are then conveniently washed off.

Copper is also used extensively in the electronics industry as an interconnect material, because of its high conductivity and resistance to electromigration. The direct writing of copper onto substrates for use in printed circuit boards is well known. The methods used to deposit copper onto the substrate are similar to the subtractive and additive methods used in the production of lithoplates employing direct metal writing.

WO93/03197 discloses a method for the production of electronic parts employing laser-induced direct copper writing. Direct writing refers to the formation of image areas consisting of element metal by the direct deposition of the elemental metal onto the image areas of a substrate, without the need for additive or substantive processed described above. Direct writing removes the need for etching processes or the use of masks or stencils. In WO 93/03197 a solution of copper formate and a crystallisation inhibiting compound, such as glycerol, citric acid or malic acid, are deposited as a thin film onto a substrate, dried and image-wise exposed to a heat source to decompose the copper formate image-wise. The non-imaged areas are then removed to leave behind deposits of elemental copper on the images areas. Using a crystallisation inhibiting compound provides films that do not crystallise during drying and can then be exposed image-wise to laser light. Lasers disclosed in WO93/03197 as suitable for use in direct copper writing include Nd: YAG, Ar$^+$, $CO_2$ and excimer lasers.

Conventional direct metal writing techniques suffer from the fact that the efficiency and speed of decomposition of the metal compound is limited by the efficiency of the metal compound in absorbing laser light sufficient to decompose the compound to elemental metal. This deficiency results in higher imaging power being needed in order to decompose the metal salt or compound to element metal in a useful time period.

In WO93/03197 the amount of laser energy needed to obtain acceptable copper images by direct writing of copper formate is in the region of 2500 J cm$^{-2}$.

The present invention provides a new heat sensitive system suitable for employing in the direct metal writing of imagable articles such as printing plates and electronic parts, which overcomes the difficulties presented in the conventional systems described above.

SUMMARY OF THE INVENTION

The inclusion of a radiation absorbing compound in a coating comprising a metal salt has been found to substantially reduce the energy needed to decompose the metal compound to elemental metal in a direct writing process.

In accordance with the present invention there is provided an imagable article comprising a thermally imagable coating on a substrate, the coating comprising a radiation absorbing compound and a metal compound which is thermally decomposable, to form a metal.

DETAILED DESCRIPTION OF THE INVENTION

The coating may comprise a composition including the radiation absorbing compound and thermally decomposable metal compound in admixture. The coating may further comprise one or more polymers useful as a film-forming compound and/or binding agent.

Suitable polymers useful as film-forming agents and/or binding agents in the present invention include gum arabic, carboxymethylcellulose or other water-soluble celluloses, dextrins, alginates, polyvinyl pyrrolidone, polyvinyl alcohol, hydrolysed polyvinyl methyl ether-maleic anhydride copolymers, and mixtures thereof.

Preferably the polymer comprises a polymer having hydroxyl groups.

Particularly useful polymers having hydroxyl groups in this invention are condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde and/or ketones, for example acetone. Dependent on the preparation route for the condensation a range of phenolic materials with varying structures and properties can be formed. Particularly useful in this invention are novolac resins, resole resins and novolac/resole resin mixtures. Most preferred are novolac resins. The type of catalyst and the molar ratio of the reactants used in the preparation of phenolic resins determines their molecular structure and therefore the physical properties of the resin. An aldehyde: phenol ratio between 0.5:1 and 1:1, preferably 0.5:1 to 0.8:1 and an acid catalyst is used to prepare novolac resins.

Examples of suitable novolac resins have the following general structure

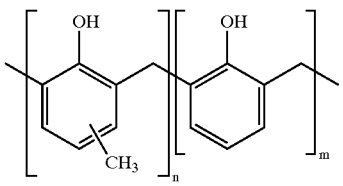

wherein the ratio of n:m is in the range of 1:20 to 20:1, and preferably 1:3 to 3:1. In one preferred embodiment, n=m. In certain embodiments, n or m may be zero.

Other polymers suitable for inclusion in the composition, notably in admixture with a phenolic, preferably novolac, resin include: a polymer or copolymer of styrene, a polymer or copolymer of hydroxystyrene, notably of 4-hydroxystyrene or 3-methyl-4-hydroxyystyrene, a polymer or copolymer of an alkoxystyrene, notably of 4-methoxystyrene, a polymer or copolymer of acrylic acid, a polymer or copolymer of methacrylic acid, a polymer or copolymer of acrylonitrile, a polymer or copolymer of acrylamide, a polymer or copolymer of vinyl alcohol, an acrylate polymer or copolymer, a polymer or copolymer of methacrylamide, a sulfonamido or imido polymer or copolymer, a polymer or copolymer of maleiimide or of alkylmaleiimide or of dialkylmaleiimide, or a polymer or copolymer of maleic anhydride (including partially hydrolysed forms).

Other suitable polymers useful as film-forming compounds and/or binding agents include poly(methyl methacrylate), epoxy resins, polyamides, solid acrylic resins, and copolymers thereof.

The coating may be dissolved in a solvent and applied to the substrate in liquid form, from which the solvent is preferably removed by evaporation.

Alternatively, the coating may be applied to a plastics film, the film bearing the coating then being laminated onto the substrate.

However, in preferred embodiments of the present invention the coating comprises at least two layers and the radiation absorbing compound and the thermally decomposable metal compound are provided in separate layers of the coating.

Each layer suitably further comprises at least one film forming agent and/or binding agent as detailed above.

In especially preferred embodiments of the invention the radiation absorbing compound is provided in an underlayer of the coating and the thermally decomposable metal compound is provided in an overlayer of the coating, the underlayer being applied to the substrate first and the overlayer being applied on top of the underlayer.

The imagable article may comprise a precursor to a lithographic printing form, but preferably the imagable article comprises a precursor to an electronic part, especially a precursor to a printed circuit board (PCB).

The substrate of the imagable articles may be constructed of any suitable material including metals, plastics materials, alloys, paper and polymeric materials.

When the imagable article of the invention is a precursor for a lithographic printing form the substrate may comprise a metal surface. Preferred metals include aluminium, zinc and titanium, or alloys thereof. Other alloys that may be useful include brass and steel. The substrate may be an aluminium plate which has undergone the usual anodic graining and post-anodic treatments well known in the lithographic art for enabling thermally imagable coating to be applied thereon. Another substrate which may be used in the present invention where the precursor is a precursor for a lithographic printing form, is a plastics material base or treated paper base as used in the photography industry. A particularly useful plastics material base is polyethylene terephthalate which has been subbed to render its surface hydrophilic. Also a so-called coated paper which has been corona discharge treated can be used.

When the imagable article of the invention is a precursor for an electronic part, the substrate preferably comprises an insulating material such as an insulating plastics material. Suitable plastics materials include polyethylene terephthalate, epoxy resins, phenolic resins, polyamides, and cellulose triacetate. The plastics material may be reinforced by fibres, preferably glass fibres. Other suitable materials for use as substrates in a precursor to an electronic part include quartz and silicon.

A large number of compounds, or combinations thereof, can be utilised as radiation absorbing compounds in the present invention.

In preferred embodiments the radiation absorbing compound absorbs infra-red radiation, for example 1065 nm radiation from a Nd-YAG laser. However, other materials which absorb other wavelength radiation e.g. 488 nm radiation from an Ar-ion laser source, may be used with the radiation being converted to heat by the radiation absorbing compound.

The radiation absorbing compound may usefully be a pigment, which is a black body or broad band absorber. Preferably, the pigment is able to efficiently absorb electromagnetic radiation and convert it to heat over a range of wavelengths exceeding 200 nm, and preferably exceeding 400 nm. Generally the pigments are not decomposed by the radiation. Suitable pigments include carbon black, lamp black, channel black, furnace black, iron blue, insoluble azo pigments, azo lake pigments, condensed azo pigments, chelate azo pigments, phthalocyanine based pigments, anthraquinone based pigments, perylene or perynone based pigments, thioindigo based pigments, quinacridone based pigments, dioxazine based pigments, vat dyeing lake pigments, azine pigments, nitroso pigments, nitro pigments.

Especially preferred pigments are carbon black, lamp black, channel black, furnace black and iron blue.

Alternatively the radiation absorbing compound may be a dye. Dyes are generally narrow band absorbers typically able efficiently to absorb electromagnetic radiation and convert it to heat only over a range of wavelengths typically not exceeding 100 nm, and so have to be selected having regard to the wavelength of the radiation which is to be used for imaging. Suitable dyes include squarylium based dyes, merocyanine based dyes, cyanine based dyes, indolizine based dyes, pyrylium based dyes and metal dithioline based dyes.

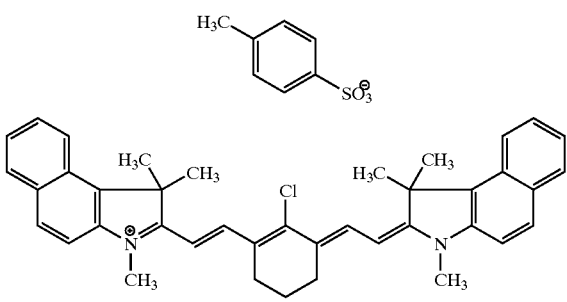

Examples of suitable dyes include:

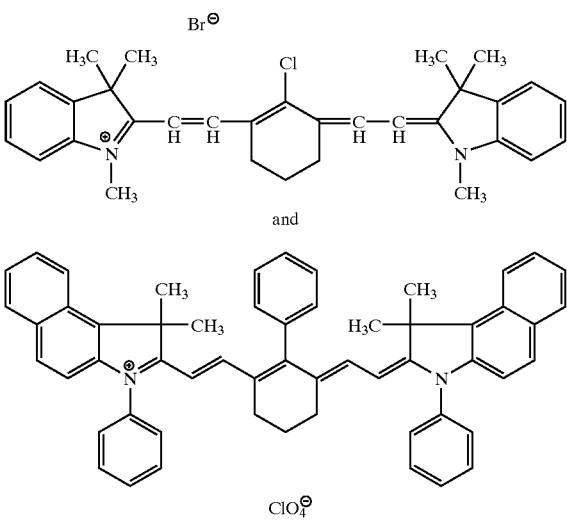

Suitably the radiation absorbing compound constitutes at least 0.25%, preferably at least 0.5%, more preferably at least 1.1%, most preferably at least 2% of the total weight of the coating. Suitably the radiation absorbing compound constitutes up to 25%, preferably up to 20%, more preferably up to 15% and most preferably up to 10% of the total weight of the coating. More specifically, the range is preferably 0.25–15% of the total weight of the coating, more preferably 0.5–10%. In all cases the figures given are as a percentage of the total weight of the dried coating.

Where the coating comprises more than one layer and the radiation absorbing compound is provided in a separate layer to the thermally decomposable metal compound, the radiation absorbing compound preferably constitutes at least 5%, more preferably at least 10%, most preferably at least 20% of the total weight of that layer. Suitably, radiation absorbing compound constitutes up to 50%, more preferably up to 30% of the total weight of that layer.

There may be more than one radiation absorbing compound. References herein to the proportion of such compound(s) are to their total content.

Metal compounds useful in the present invention include any copper compound which can be thermally decomposed to produce metallic copper. Suitable copper compounds include copper salts, alkyl copper compounds, carbonyl-containing copper compounds, organic copper compounds, fluorinated organic copper compounds or (triethylphosphine) cyclopentadienyl copper (I). Particularly preferred copper compounds are copper formate, copper acetate and copper nitrate, with copper formate being especially preferred.

Other thermally decomposable metal compounds useful in the present invention include zinc compounds. Preferred zinc compounds are zinc acetate and zinc nitrate.

According to a second aspect of the present invention there is provided a composition comprising a radiation absorbing compound and a thermally imagable metal compound, the composition having the property that when provided as a coating on a substrate, regions which have been imaged selectively decompose to yield elemental metal, leaving behind regions which have not been imaged.

The radiation absorbing compound and thermally decomposable metal compound may be as defined above.

According to a third aspect of the present invention there is provided a method of manufacturing an imagable article of the first aspect of the invention, the method comprising the step of applying the coating of the invention defined herein, to a substrate.

Suitably the coating is dissolved in a solvent and applied to the substrate in liquid form. The solvent may then be removed by evaporation. Alternatively, the coating may be applied to a plastics film, the film bearing the coating then being heat laminated to the substrate.

Where the coating comprises more than one layer, the method may comprise applying an underlayer comprising the radiation absorbing compound to a substrate, and subsequently applying an overlayer comprising the thermally decomposable metal compound on top of the underlayer. Preferably each layer of the coating is dissolved in a solvent and applied in liquid form, the solvent being subsequently removed by evaporation.

According to a fourth aspect of the invention there is provided a method of manufacturing an imaged article from an imagable article of the invention as detailed herein, the method comprising the steps of:

a) exposing the coating as described herein imagewise; and b) removing the non-exposed regions of the coating, using a developer liquid.

The imaging of selected areas is preferably effected by the use of infra-red electromagnetic radiation, the coating comprising an infra-red absorbing compound as defined above. By infra-red radiation is meant electromagnetic radiation having a wavelength substantially between 600 nm and 1400 nm.

In preferred methods the electromagnetic radiation employed for exposure is of wavelength at least 600 nm, preferably at least 700 nm and more preferably at least 750 nm. Most preferably it is at least 800 nm. Suitably the radiation is of wavelength not more than 1400 nm, preferably not more than 1300 nm, more preferably not more than 1200 nm and most preferably not more than 1150 nm. A preferred range of electromagnetic radiation employed for exposure is between 700 nm and 1200 nm.

The radiation may be delivered by a laser under digital control. Examples of lasers which can be used to expose coatings suitable for the method of the present invention include semiconductor diode lasers emitting between 600 nm and 1400 nm, especially between 700 nm and 1200 nm. One example is the Nd YAG laser used in the Barco Crescent 42/T thermal image setter which emits at 1064 nm and another is the diode laser used in the Creo Trendsetter thermal image setter, which emits at 830 nm, but any laser of sufficient imaging power and whose radiation is absorbed by the coating can be used.

Suitably imaging is effected using an imaging energy of no more than 5 mJcm$^{-2}$, preferably no more than 2.5 mJcm$^{-2}$, more preferably no more than 1.5 mJcm$^{-2}$. Preferably imaging is effected using an imaging energy of at least 100 mJcm$^{-2}$, more preferably at least 250 mJcm$^{-2}$, and most preferably at least 500 mJcm$^{-2}$.

Suitably the developer liquid is an aqueous developer, preferably water.

In accordance with a fifth aspect of the present invention there is provided an article comprising a substrate bearing an image thereon, produced by the method of the fourth aspect. The article may be a lithographic printing form but is preferably an electronic part, especially a printing circuit board (PCB).

In accordance with a sixth aspect of-the present invention there is provided an imagable article having a thermally imagable coating on a substrate, the coating comprising a radiation absorbing compound and a thermally decomposable metal compound, the coating being able to absorb incident radiation in the wavelength range 600–1400 nm and converting it to heat, the coating having the property that when provided on a substrate, imagewise exposed and subjected to a developer, in regions that have been exposed the thermally decomposable metal compound is decomposed to elemental metal, and regions that have not been exposed dissolve in the developer leaving behind the regions of elemental metal.

The following examples serve to further illustrate the present invention:

EXAMPLE 1

Materials and Equipment

The following products are referred to hereinafter:

PMMA—Poly (methyl methacrylate), $M_w$=15000, as supplied by Aldrich Chemical Company, Dorset, UK.

Stag—Stag epoxide resin 940 as supplied by Stag polymers and Sealants Limited, West Drayton, Middlesex, UK.

Dye A—having the structure:

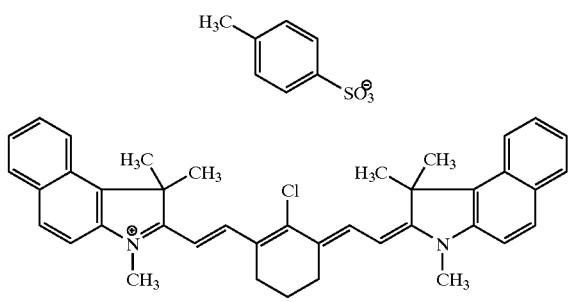

Copper formate-copper 11 formate hydrate, $(HCO_2)_2Cu.xH_2O$ as supplied by Aldrich.

Ambergum 3085—a cellulose, as supplied by Aqualon Limited, Chester, UK.

NL05—a poly vinyl alcohol, grade Gohsenol KL05 as supplied by British Traders and Shippers Limited, Dagenham, Essex, UK.

Creo Trendsetter 3244, a commercially available plate setter using Procomm Plus software, operating at a wavelength of 830 nm at powers of up to 8 W and supplied by Creo Products Inc. of Burnaby, Canada.

Precursor support A: double sided copper laminate of overall thickness 254 micron, having a copper cladding 18 micro thick on each side of an insulating substrate, catalogue number N4105–2, 0.008, H/THE, as supplied by New England Laminates (UK) Limited of Skelmersdale, UK.

Support A: the precursor support A was stripped of its copper using cupric chloride etchant to reveal the flexible composite inside.

Underlayer coating formulations were prepared as solutions in 1-methoxypropan-2-ol. Toplayer coating formulations were prepared as solutions in distilled water. The coating solutions were coated onto support A by means of a wire would bar. The solution concentrations were selected to provide coating weights as described in the table below, after thorough drying at 115 C for 150 seconds in aMathis labdryer oven (as supplied by Werner Mathis AG, Germany).

All percentages given below are expressed as total content % w/w in the respective dried coating layer.

| | Underlayer | | | | Toplayer | | | |
|---|---|---|---|---|---|---|---|---|
| Example | Dye A % w/w | PMMA % w/w | Stag % w/w | Film Weight (g) | Copper Formate % w/w | Ambergum % w/w | KL05 % w/w | Film Weight (g) |
| 1 | 30 | 70 | | 0.5 | 90 | 10 | | 2.4 |
| 2 | 50 | 50 | | 0.5 | 90 | 10 | | 2.4 |
| 3 | 30 | | 70 | 0.5 | 90 | 10 | | 2.4 |
| 4 | 50 | | 50 | 0.5 | 90 | 10 | | 2.4 |
| 5 | 30 | 70 | | 1.0 | 90 | 10 | | 2.4 |
| 6 | 30 | | 70 | 1.0 | 90 | 10 | | 2.4 |
| 7 | 50 | | 50 | 1.0 | 90 | 10 | | 2.4 |
| 8 | 50 | 50 | | 0.5 | 90 | 10 | | 4.0 |

-continued

| | Underlayer | | | | Toplayer | | | |
|---|---|---|---|---|---|---|---|---|
| Example | Dye A % w/w | PMMA % w/w | Stag % w/w | Film Weight (g) | Copper Formate % w/w | Ambergum % w/w | KL05 % w/w | Film Weight (g) |
| 9 | 30 | | 70 | 0.5 | 90 | 10 | | 4.0 |
| 10 | 50 | | 50 | 0.5 | 90 | 10 | | 4.0 |
| 11 | 30 | 70 | | 1.0 | 90 | 10 | | 4.0 |
| 12 | 30 | | 70 | 0.5 | 90 | 10 | | 1.2 |
| 13 | 20 | | 80 | 0.5 | 90 | 10 | | 1.2 |
| 14 | 10 | | 90 | 0.5 | 90 | 10 | | 1.2 |
| 15 | 30 | | 70 | 0.5 | 90 | 10 | | 0.6 |
| 16 | 20 | | 80 | 0.5 | 90 | 10 | | 0.6 |
| 17 | 10 | | 90 | 0.5 | 90 | 10 | | 0.6 |
| 18 | 30 | | 70 | 0.5 | 90 | | 10 | 1.2 |
| 19 | 20 | | 80 | 0.5 | 90 | | 10 | 1.2 |
| 20 | 10 | | 90 | 0.5 | 90 | | 10 | 1.2 |
| 21 | 30 | | 70 | 0.5 | 90 | | 10 | 0.6 |
| 22 | 20 | | 80 | 0.5 | 90 | | 10 | 0.6 |
| 23 | 10 | | 90 | 0.5 | 90 | | 10 | 0.6 |

The formulations were imaged with an internal test pattern at 800 and 1200 mJcm$^{-2}$ using the Creo Trendsetter 3244. The unexposed areas were then removed by immersion in water for 60 seconds.

Two tests were then carried out to ensure copper had been produced on imaging:

1) elemental analysis
2) The copper image produced was removed with cupric chloride etchant.

In all cases in the table below, where an image is defined as weak, medium or strong, the tests carried out in 1 and 2, showed the image produced, to be copper. A viual appraisal (weak, medium, strong) of the image was also made, especially concentrating on strength of image and its adhesion, as shown in the table below. It is clear that image quality is dependant on coating film weight, dye quantity, and amount of inert binder used. (In the case of "no image", a formulation just required more image power—in these cases increased from 800 mJcm$^{-2}$ up to 1200 mJcm$^{-2}$, before decomposition of the composition was seen).

| Example | Imaged at 800 mJcm$^{-2}$ | Imaged at 1200 mJcm$^{-2}$ |
|---|---|---|
| 1 | No image | Medium |
| 2 | No image | Weak |
| 3 | Weak | Strong |
| 4 | No image | Strong |
| 5 | No image | Weak |
| 6 | No image | Weak |
| 7 | No image | Weak |
| 8 | Weak | Medium |
| 9 | No image | Medium |
| 10 | No image | Weak |
| 11 | No image | Weak |
| 12 | Strong | Strong |
| 13 | Weak | Strong |
| 14 | No image | Weak |
| 15 | Strong | Strong |
| 16 | Weak | Strong |
| 17 | No image | Weak |
| 18 | Strong | Strong |
| 19 | Medium | Strong |
| 20 | No image | Weak |
| 21 | Strong | Strong |
| 22 | Medium | Strong |
| 23 | No image | Weak |

The terms "weak", "medium" and "strong" image are defined as follows:

A weak image is an image formed after the unexposed areas are removed, which image is detectable by visual appraisal, but faint and diffuse.

A medium image is an image formed after the unexposed areas are removed, which image has some definition and outline, but may be faint in parts.

A strong image is an image formed after the unexposed areas are removed, which image has bold definition and outline.

We claim:

1. An imagable article comprising a thermally imagable coating on a substrate, the coating comprising a radiation absorbing compound and a metal compound which is thermally decomposable, to form a metal, wherein the coating comprises at least two layers and the radiation absorbing compound and the thermally decomposable metal compound are provided in separate layers of the coating.

2. An imagable article as claimed in claim 1, wherein the coating further comprises one or more polymer film-forming compounds.

3. An imagable article as claimed in claim 2, wherein the or each film-forming compound is selected from gum arabic, carboxymethyl cellulose, dextrin, alginate, polyvinyl pyrrolidone, polyvinyl alcohol, hydrolysed polyvinyl methyl ether-maleic anhydride copolymer, polyamide acrylic resin, epoxy resin, poly(methyl acrylate), novolak resin, resole resin; and copolymers thereof.

4. An imagable article as claimed in claim 1, wherein the radiation absorbing compound is provided in an underlayer of the coating and the thermally decomposable metal compound is provided in an overlayer of the coating, the underlayer being applied to the substrate first, and the overlayer being applied on top of the underlayer.

5. An imagable article as claimed in claim 1, wherein the imagable article comprises a precursor to a lithographic printing form or a precursor to an electronic part.

6. An imagable article as claimed in claim 1, wherein the radiation absorbing compound is capable of absorbing infrared radiation and converting it to heat.

7. An imagable article as claimed in claim 6, wherein the radiation absorbing compound is a pigment.

8. An imagable article as claimed in claim 7, wherein the pigment is selected from carbon black, lamp black, channel black, furnace black and iron blue.

9. An imagable article as claimed in claim 6, wherein the radiation 2 absorbing compound is a dye.

10. An imagable article as claimed in claim 9, wherein the dye is selected from a squarylium dye, merocyanine dye, cyanine dye, indolizine dye, pyrylium dye and a metal dithioline dye.

11. An imagable article as claimed in claim 1, wherein the radiation absorbing compound is present in an amount of0.25–15% of the total weight of the coating.

12. An imagable article as claimed in claim 11, wherein the radiation absorbing compound is present in an amount of 0.5–10% of the total weight of the coating.

13. An imagable article as claimed in claim 1, wherein the thermally decomposable metal compound is a thermally decomposable copper compound.

14. An imagable article as claimed in claim 13, wherein the copper compound is selected from copper formate, copper acetate and copper nitrate.

15. A method of manufacturing an imagable article comprising the step of applying a coating to a substrate, said coating comprising a radiation absorbing compound and a metal compound which is thermally decomposable to form a metal, wherein the coating comprises at least two layers and the radiation absorbing compound and the thermally decomposable metal compound are provided in separate layers of the coating.

16. A method as claimed in claim 15, wherein the coating is dissolved in a solvent and applied to the substrate in liquid form.

17. A method as claimed in claim 15, the method comprising:

(a) applying an underlayer comprising a radiation absorbing compound to a substrate; and (b) subsequently applying an overlayer comprising the thermally decomposable metal compound on top of the underlayer.

18. An imagable article having a thermally imagable coating on a substrate, the coating comprising a radiation absorbing compound and a thermally decomposable metal compound, the coating being able to absorb incident radiation in the wavelength range 600–1400 nm and convert it to heat, the coating having the property that when provided on a substrate, imagewise exposed and subjected to a developer, in regions that have been exposed the thermally decomposable metal compound is decomposed to elemental metal and regions that have not been exposed dissolve in the developer leaving behind the regions of elemental metal.

* * * * *